United States Patent
Hashimoto et al.

(10) Patent No.: US 6,841,192 B2
(45) Date of Patent: Jan. 11, 2005

(54) METHOD FOR MANUFACTURING PIEZOELECTRIC ELEMENT, PIEZOELECTRIC ELEMENT, AND DROPLET-EJECTING RECORDING HEAD

(75) Inventors: Takashi Hashimoto, Chino (JP); Setsuya Iwashita, Nirasaki (JP); Takamitsu Higuchi, Matsumoto (JP); Hiromu Miyazawa, Toyashina-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/417,793

(22) Filed: Apr. 17, 2003

(65) Prior Publication Data

US 2004/0013794 A1 Jan. 22, 2004

(30) Foreign Application Priority Data

Apr. 19, 2002 (JP) .................................. 2002-117849
Jan. 29, 2003 (JP) .................................. 2003-020804

(51) Int. Cl.[7] ................................................ B05D 5/12
(52) U.S. Cl. .................... 427/100; 427/261; 427/376.1; 427/383.1; 427/402; 427/558

(58) Field of Search ......................... 427/376.1, 383.1, 427/100, 402, 558, 258, 261

(56) References Cited

U.S. PATENT DOCUMENTS

| | | | | |
|---|---|---|---|---|
| 5,670,999 A | * | 9/1997 | Takeuchi et al. | 347/70 |
| 6,097,412 A | * | 8/2000 | Tsukada et al. | 347/68 |
| 6,168,746 B1 | | 1/2001 | Chatterjee et al. | |
| 6,320,738 B1 | * | 11/2001 | Yamana et al. | 361/321.2 |
| 2003/0030689 A1 | * | 2/2003 | Hashimoto et al. | 347/20 |
| 2004/0004209 A1 | * | 1/2004 | Matsuba et al. | 252/518.1 |

FOREIGN PATENT DOCUMENTS

JP  05-286131      11/1993
JP  05-335860 A  * 12/1993   .......... H03H/3/007

* cited by examiner

*Primary Examiner*—Brian K. Talbot
(74) *Attorney, Agent, or Firm*—Harness, Dickey & Pierce, P.L.C.

(57) ABSTRACT

A liquid material containing metal particles is directly applied onto a piezoelectric layer with an inkjet head to form a pattern portion, and the applied liquid material is transformed into a metal layer by heat treatment.

8 Claims, 8 Drawing Sheets

[FIG. 1]
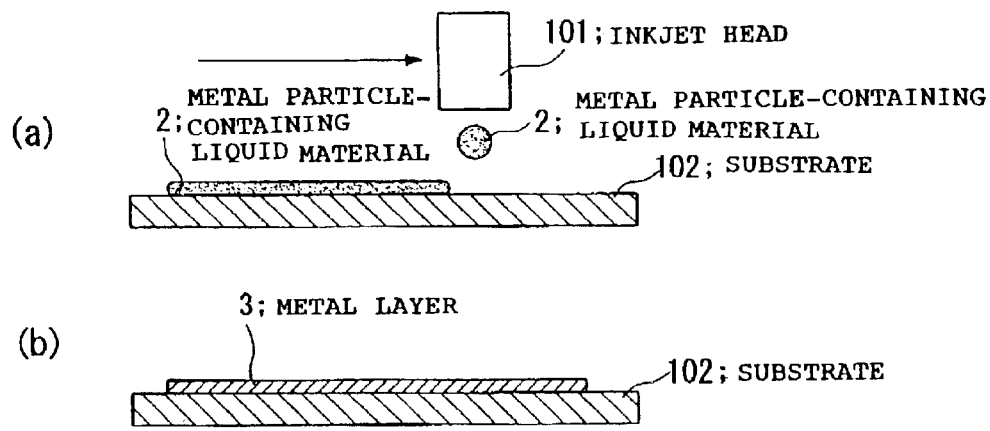
[FIG. 2]
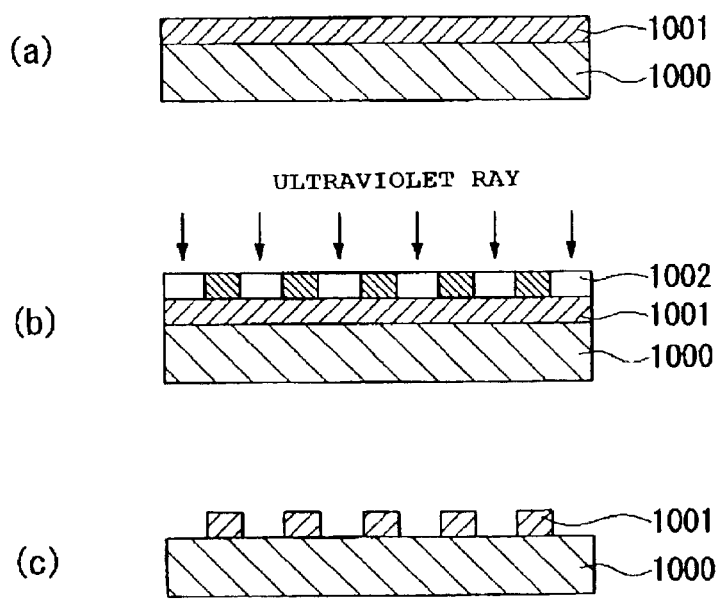

[FIG. 3]
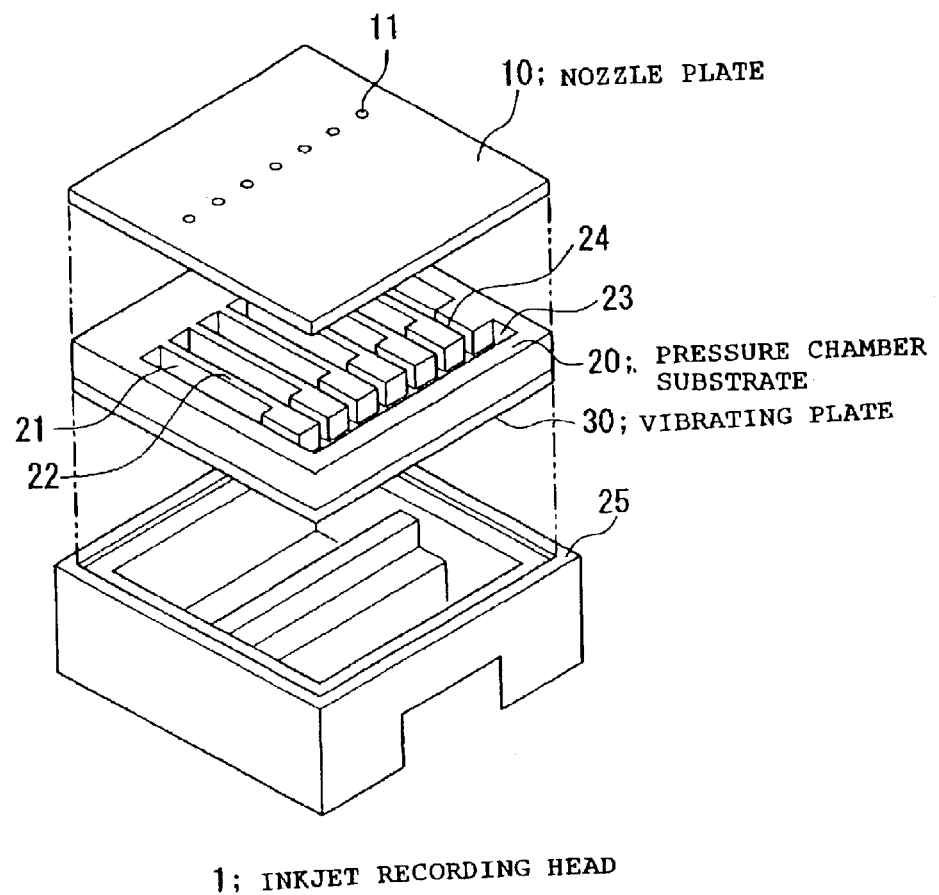
1; INKJET RECORDING HEAD

[FIG. 4]
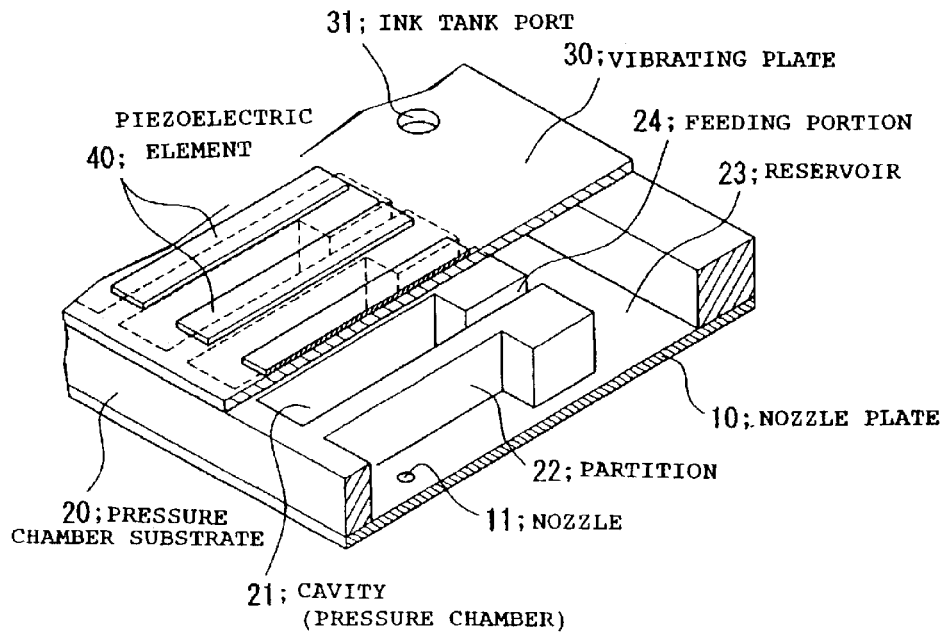
[FIG. 5]
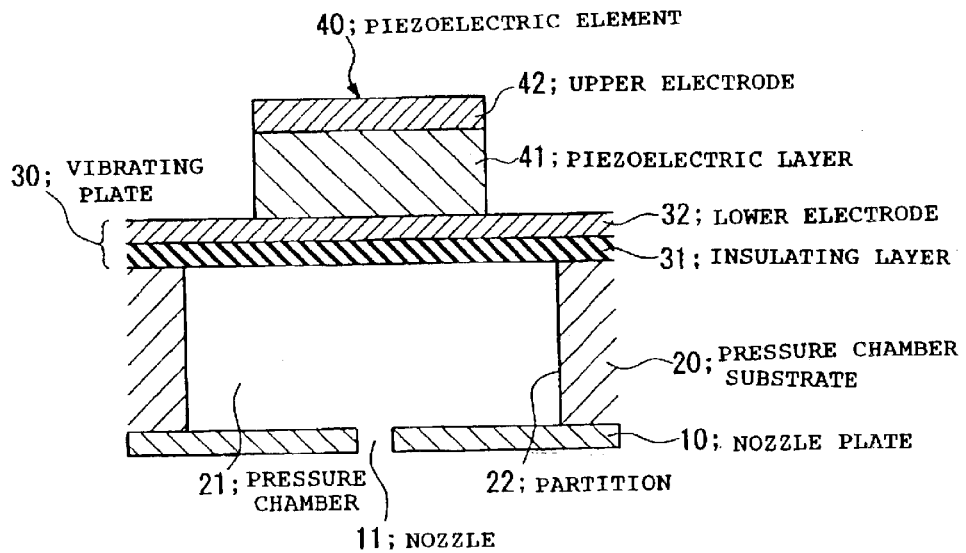

[FIG. 6]
(a) 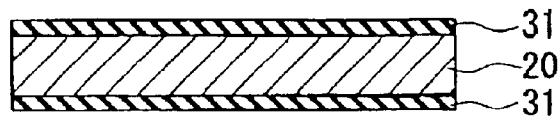
(b) 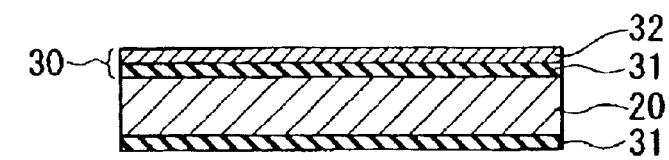
(c) 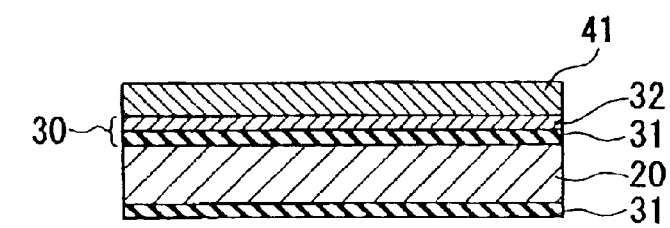
(d) 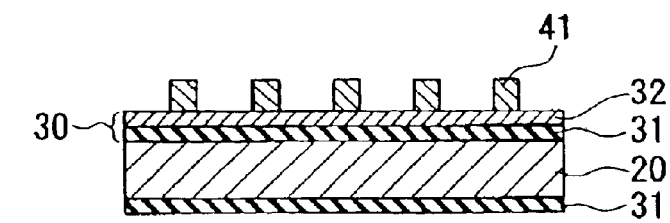
(e) 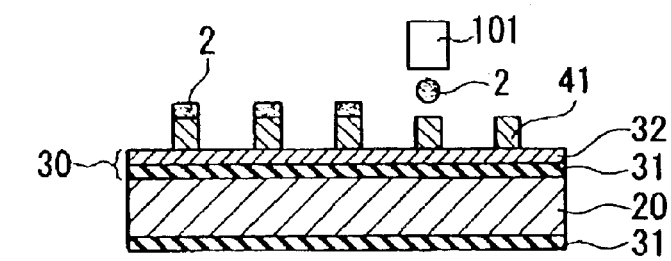
(f) 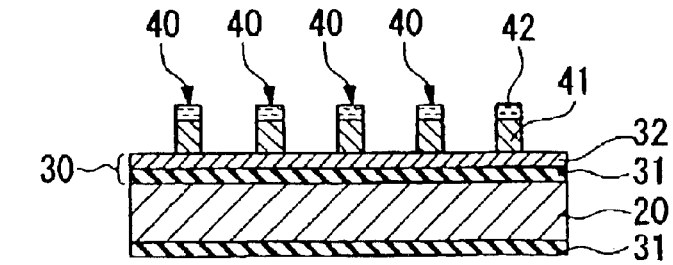

[FIG. 7]
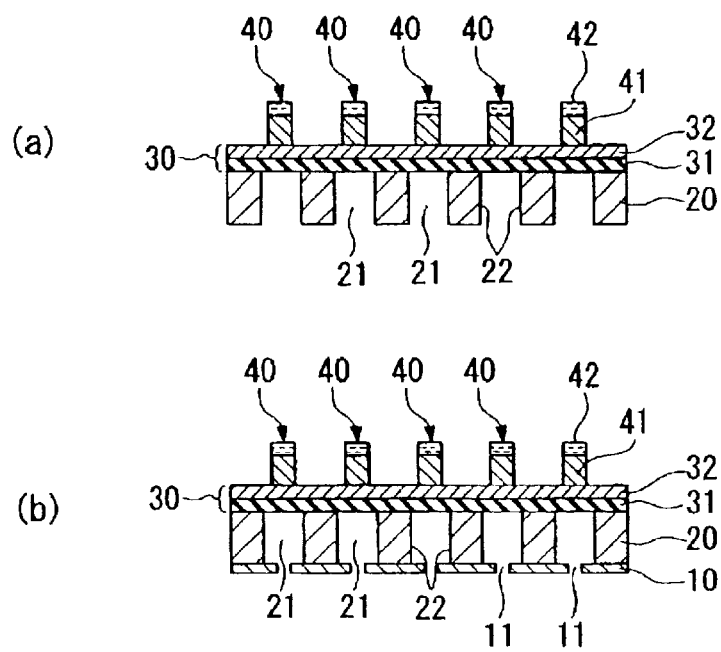

[FIG. 8]
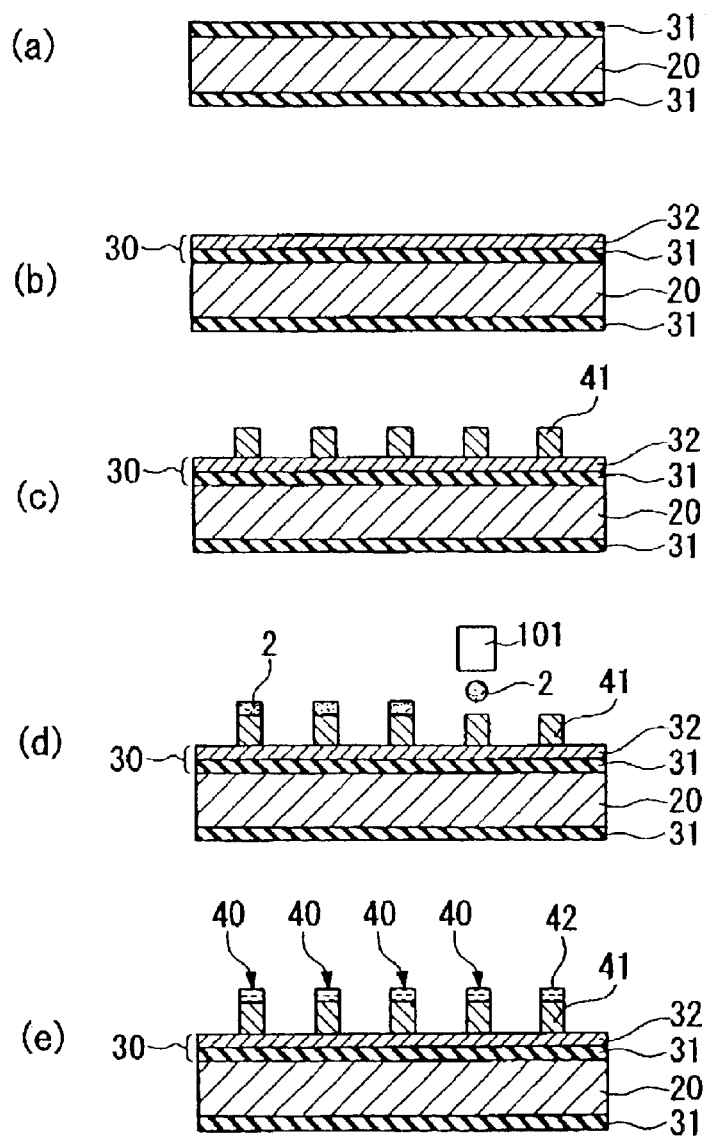

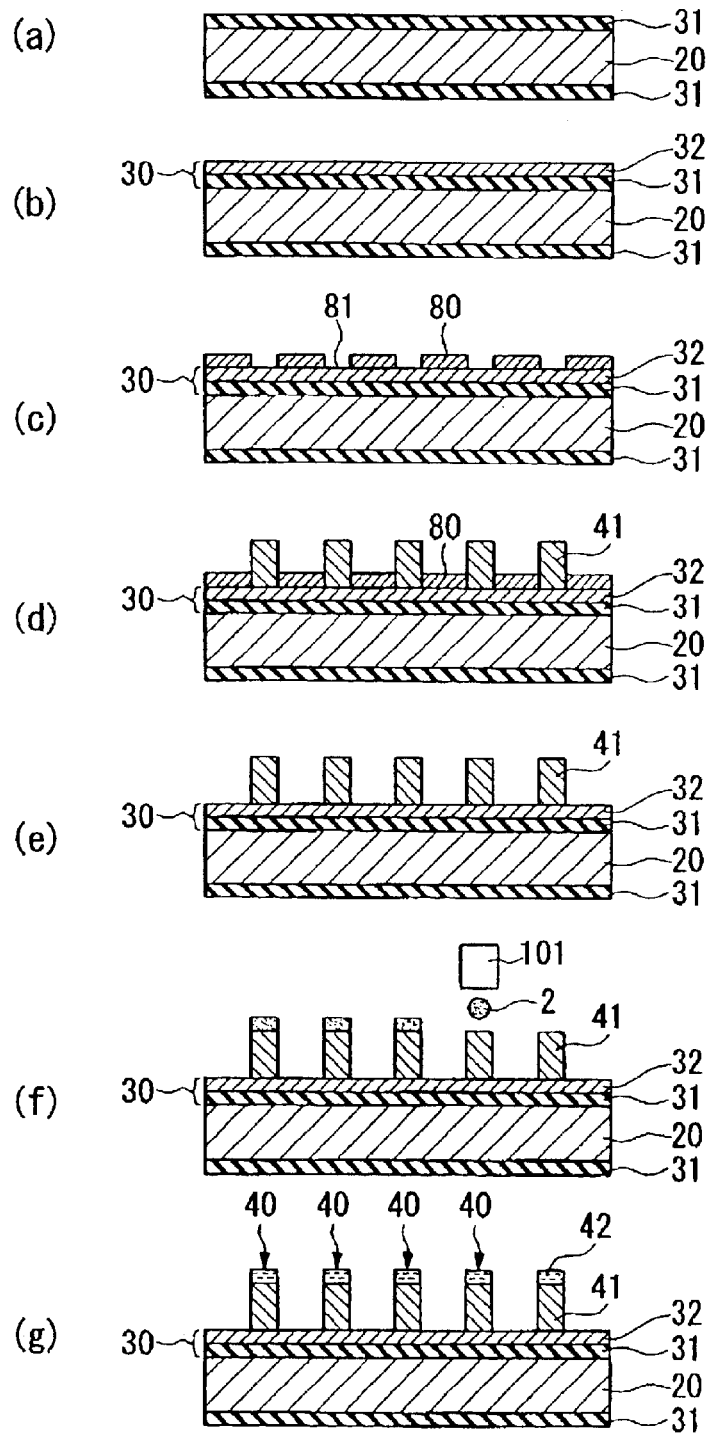
[FIG. 9]

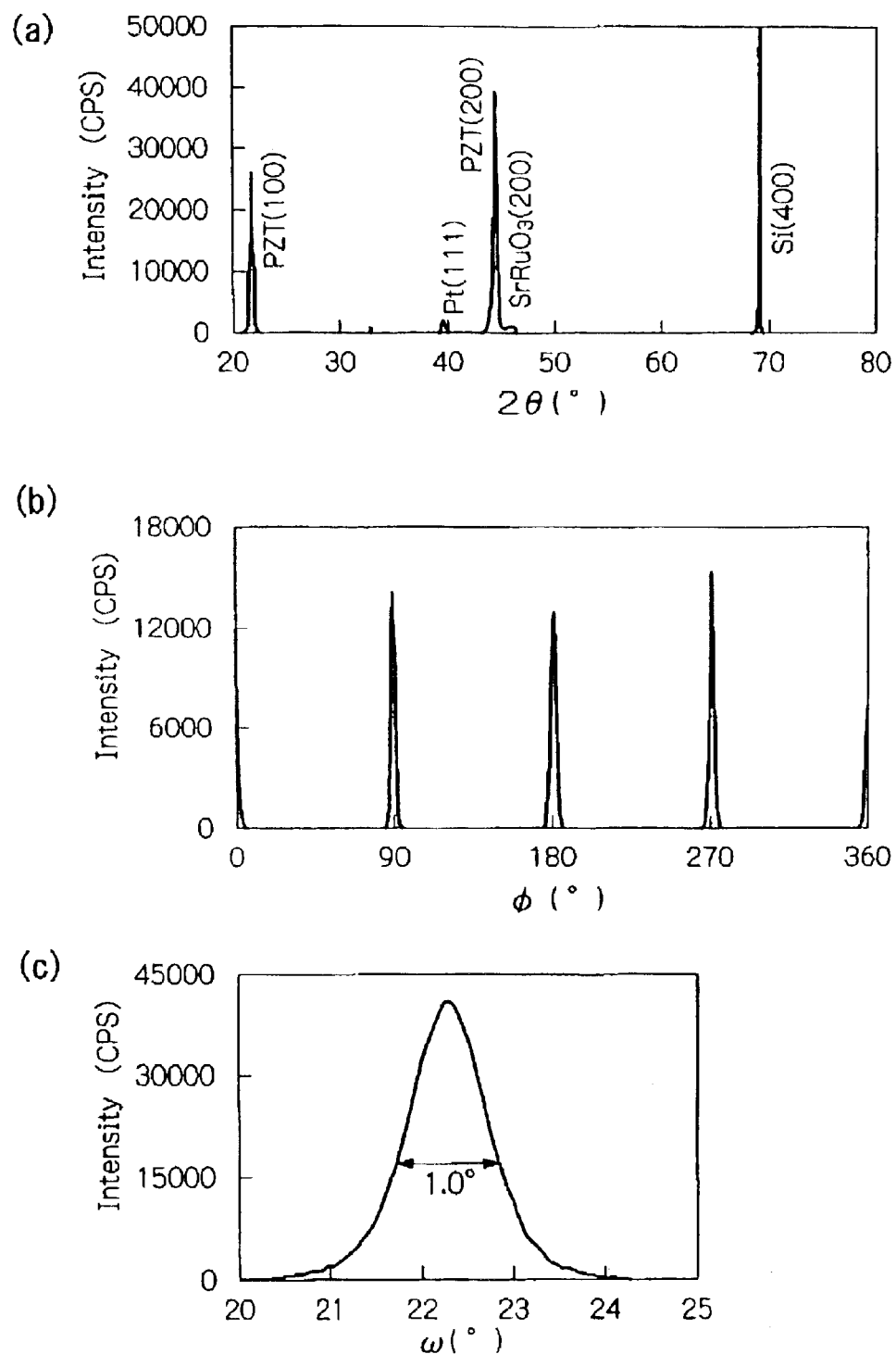
[FIG. 10]

METHOD FOR MANUFACTURING PIEZOELECTRIC ELEMENT, PIEZOELECTRIC ELEMENT, AND DROPLET-EJECTING RECORDING HEAD

BACKGROUND OF THE INVENTION

1. Technical Field of the Invention

The present invention relates to a method for manufacturing piezoelectric elements used for droplet-ejecting recording heads, nonvolatile semiconductor storage, thin-film capacitors, sensors, surface acoustic wave elements, filters, surface acoustic wave light guides, optical memories, spatial light modulators, and the like and also relates to a piezoelectric element and a droplet-ejecting recording head.

2. Description of the Related Art

In general, conventional piezoelectric elements include an upper and a lower electrode and a polycrystalline piezoelectric thin-film disposed therebetween. The piezoelectric thin-film is generally classified into a two-component system or a three-component system depending on the composition, wherein the two-component system mainly contains lead zirconate titanate, hereinafter referred to as PZT, and the three-component system contains a third component in addition to the PZT of the two-component system. The piezoelectric thin-film having such composition can be formed by a sputtering method, a sol-gel method, a laser-ablation method, a CVD method, and the like.

When the piezoelectric elements are used for droplet-ejecting recording heads, the piezoelectric elements must include a piezoelectric thin-film that has a thickness of 0.5 to 20 μm. This piezoelectric thin-film must further have a large coefficient of piezoelectric strain.

On the other hand, the upper and lower electrodes of the piezoelectric element contain a conductive material such as platinum, iridium, ruthenium, titanium, gold, and nickel.

Recently, various droplet-ejecting recording heads including the above-mentioned piezoelectric elements have been proposed. In conventional methods for manufacturing the piezoelectric elements, the upper electrode is formed as follows: the lower electrode and the piezoelectric thin-film are formed over a substrate in that order, the upper electrode is provided over the piezoelectric thin-film using platinum by a sputtering method, the resulting upper electrode is then etched to remove unnecessary portions together with the piezoelectric thin-film by a photolithographic method; or such a structure is formed by a printing method such as a screen printing method (see, for example, Japanese Unexamined Patent Application Publication No. 5-286131).

However, in the photolithographic method, there is a problem in that the manufacturing cost is high and the tact time is long because the utilization efficiency of raw materials is low and the manufacturing steps are complicated. In the printing method, there is a problem in that the formation of a micro-pattern is difficult, a mask must be prepared for each pattern, and obtained metal layers have high resistance because metal paste for forming the metal layers contains a large amount of binder for increasing the viscosity of the paste. The patterning of the piezoelectric element has the same problem as the above.

Accordingly, in order to solve the above problems, it is an object of the present invention to provide a method for manufacturing a piezoelectric element at low cost in a short tact time, a piezoelectric element, and a droplet-ejecting recording head, wherein the piezoelectric element includes an upper electrode having low resistance.

SUMMARY

The present invention provides a method for manufacturing a piezoelectric element including a piezoelectric layer containing a ferroelectric material, wherein the method includes the steps of applying droplets of liquid containing a solvent and metal particles dispersed in the solvent to the piezoelectric layer, removing the solvent from the applied droplets by heat treatment, and sintering the metal particles to form a metal layer.

According to the present invention, since the metal layer of the piezoelectric element is directly formed by a coating method, the utilization efficiency of raw materials is substantially 100% and therefore the manufacturing cost is low. Furthermore, the manufacturing process can be simplified because a mask is not necessary.

In the method for manufacturing a piezoelectric element according to the present invention, the droplets are applied by a droplet ejecting method and the metal particles are coated with an organic material.

Thus, a fine pattern can be formed and a metal layer having low resistance can be formed in a short tact time. Furthermore, the droplets can be continuously ejected with, for example an inkjet device because the coated metal particles are dispersed in the solvent in a stable manner.

The method for manufacturing a piezoelectric element according to the present invention further includes a step of adjusting the content of the metal particles dispersed in the solvent so as to obtain a metal layer having a desired thickness.

Thus, the manufacturing process can be simplified because the thickness of the metal layer formed in one shot with an inkjet device can be controlled.

In the method for manufacturing a piezoelectric element according to the present invention, the metal particles may contain any one of platinum and gold.

Thus, the metal layer has low electrical resistance, high resistance to oxidation, and high stability.

In the method for manufacturing a piezoelectric element according to the present invention, the liquid contains a precursor of a ferroelectric material, the liquid droplets are applied by the droplet ejecting method, the solvent of the droplets is removed by heat treatment, and the precursor is transformed into a ferroelectric layer to form the piezoelectric layer.

Thus, the manufacturing process of the piezoelectric element can be simplified, thereby reducing the manufacturing cost.

In the method for manufacturing a piezoelectric element according to the present invention, the liquid is applied onto a substrate including a pattern portion having lyophobic regions and lyophilic regions.

Thus, a pattern portion of a metal layer or a ferroelectric layer can be readily formed with high preciseness. Furthermore, another pattern portion having a size smaller than that of the droplets of the applied liquid can be formed.

The method for manufacturing a piezoelectric element according to the present invention further includes a step of forming the pattern portion, wherein the step includes the sub-steps of providing a self-organizing film comprising fluoroalkylsilane on the substrate and then irradiating the self-organizing film with ultraviolet rays on desired areas to remove parts of the self-organizing film to form the lyophilic regions, and the remaining parts of the self-organizing film function as the lyophobic regions.

Thus, a pattern portion having the lyophobic regions and the lyophilic regions can be readily formed, thereby providing a substrate having the lyophobic regions and the lyophilic regions. Thereby, high-precision arrangement can be readily obtained and a pattern portion having a size smaller than that of the droplets of the applied liquid can be formed.

In the method for manufacturing a piezoelectric element according to the present invention, the piezoelectric layer contains at least one element selected from the group consisting of lead zirconate titanate (PZT) represented by the formula $Pb(Zr—Ti)O_3$, lead lanthanum titanate represented by the formula $(Pb—La)TiO_3$, lead lanthanum zirconate (PLZ) represented by the formula $(Pb—La)ZrO_3$, lead magnesium niobate titanate (PMN-PT) represented by the formula $Pb(Mg—Nb)TiO_3$, lead magnesium niobate zirconate titanate (PMN-PZT) represented by the formula $Pb(Mg—Nb)(Zr—Ti)O_3$, lead lanthanum zirconate titanate (PLZT) represented by the formula $(Pb—La)(Zr—Ti)O_3$ lead zinc niobate titanate (PZN-PT) represented by the formula $Pb(Zn—Nb)TiO_3$, lead scandium niobate titanate (PSN-PT) represented by the formula $Pb(Sc—Nb)TiO_3$, lead nickel niobate titanate (PNN-PT) represented by the formula $Pb(Ni—Nb)TiO_3$, and compounds represented by the formulas $(Ba_{1-x}Sr_x)TiO_3$, $Bi_4Ti_3O_{12}$, $SrBi_2Ta_2O_9$, $LiNbO_3$, $LiTaO_3$, and $KNbO_3$, where $0 \leq x \leq 0.3$.

Thus, a piezoelectric element having superior piezoelectric characteristics can be manufactured.

A piezoelectric element of the present invention is manufactured by a method for manufacturing a piezoelectric element according to the present invention. Furthermore, a droplet-ejecting recording head of the present invention includes the above piezoelectric element of the present invention.

Accordingly, the present invention provides such a piezoelectric element having superior characteristics and such a droplet-ejecting recording head that can be readily manufactured at low cost.

BRIEF DESCRIPTION OF THE DRAWINGS

FIGS. 1a and 1b are illustrations showing a method for forming a metal layer by an inkjet method.

FIGS. 2a-2c are illustrations showing a method for forming a pattern portion having lyophobic regions and lyophilic regions.

FIG. 3 is an exploded perspective view showing an inkjet recording head according to the present invention.

FIG. 4 is a perspective view showing the inkjet recording head according to the present invention.

FIG. 5 is a sectional view illustrating a layered structure of a piezoelectric element according to the present invention.

FIGS. 6a-6f are illustrations showing a method for manufacturing an inkjet recording head.

FIGS. 7a and 7b are illustrations showing a method for manufacturing an inkjet recording head.

FIGS. 8a-8e are illustrations showing a method for manufacturing an inkjet recording head.

FIGS. 9a-9g are illustrations showing a method for manufacturing an inkjet recording head.

FIGS. 10a-10c are illustrations showing analysis results of the PZT piezoelectric thin-film of example 2.

DETAILED DESCRIPTION

The embodiments of the present invention will now be described with reference to the accompanying drawings.

In the present invention, a droplet ejecting method is referred to as a method for ejecting droplets so as to form a material portion having a predetermined pattern on a substrate and may be called an inkjet method. The ejected droplets are herein different from ink droplets used for printing but are equivalent to droplets of a liquid material containing a material for forming devices. This material contains, for example, a conductive sub-material, an insulating sub-material or the like for forming devices. This droplet ejecting method is not limited to a method for ejecting droplets in a spraying manner and includes a method for continuously ejecting each droplet.

Step of Forming Metal Layer by Inkjet Method

The following procedure is outlined below with reference to FIG. 1: liquid containing metal particles is applied onto a substrate by an inkjet method and the applied liquid is transformed into a metal layer by heat treatment.

As shown in FIG. 1(a), a liquid material 2 containing metal particles is ejected from an inkjet head 101 and then applied onto a first substrate 102. The metal particles used herein contain at least one member selected from the group consisting of gold, silver, copper, palladium, nickel, platinum, iridium, ruthenium, and titanium. The liquid material 2 is a dispersion containing a solvent and the metal particles dispersed in the solvent. In order to uniformly disperse the metal particles, the metal particles may be coated with an organic material. The metal particles preferably have a size of 50 nm to 0.1 μm in consideration that the metal particles are readily dispersed in the solvent and the inkjet method is used.

The liquid material 2 is prepared by adding the metal particles to the solvent. The solvent preferably has a vapor pressure of 0.001 to 200 mmHg at room temperature.

When the vapor pressure is more than 200 mmHg, high-quality layers cannot be obtained by the above application method because the solvent is rapidly vaporized during the application. In contrast, when the vapor pressure is less than 0.001 mmHg, the solvent is apt to remain in a layer formed by the application method since the solvent is extremely slowly vaporized, and therefore high-quality conductive layers cannot be obtained in a heat treating step and/or a photo processing step described below. The solvent more preferably has a vapor pressure of 0.001 to 50 mmHg. When the vapor pressure is more than 50 mmHg, it is difficult to continuously eject droplets using an inkjet device, because the nozzles of; the inkjet device become clogged with the metal particles once the solvent evaporates.

The solvent is not limited to a particular type and may be one in which the metal particles are dispersed and are not aggregated. Such a solvent includes water; alcohol solvents such as methanol, ethanol, propanol, and butanol; hydrocarbon solvents such as n-heptane, n-octane, decane, toluene, xylenes, cymene, durene, indene, dipentene, tetrahydronaphthalene, decahydronaphthalene, and cyclohexylbenzene; ether solvents such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis-(2-methoxyethyl) ether, and p-dioxane; and polar solvents such as propylene carbonate, y-butyrolactone, N-methyl-2-pyrrolidone, dimethylformamide, dimethylsulfoxide, and cyclohexane. These solvents may be used alone or in combination. Among these solvents, water, the alcohol solvents, the hydrocarbon solvents, and the ether solvents are preferable in consideration that the dispersibility of the metal particles and the stability of the dispersion are superior and such solvents are suitable for the inkjet method. In particular, water and the hydrocarbon solvents are preferable.

The content of the metal particles dispersed in the solvent is 1 to 80% by weight. The content may be varied depending on the desired thickness of the metal layer. When the content exceeds 80%, the aggregation of the metal particles is caused and therefore a uniform layer cannot be obtained. The dispersion containing the metal particles may further contain a surface tension modifier in a small amount according to needs as long as the performance of the dispersion is not deteriorated.

A nonionic surface tension modifier improves the dispersion in wettability to applying objects and also improves the leveling of a formed layer, thereby preventing an irregular surface or an orange peel surface from being caused on the layer. The dispersion containing the metal particles preferably has a viscosity of 1 to 50 mPa.s. When the viscosity is less than 1 mPa.s, the dispersion spreads over the periphery of nozzles of inkjet heads, thereby causing the fouling of the nozzle periphery. On the other hand, when the viscosity is more than 50 mPa.s, the nozzles are clogged at frequent intervals, thereby preventing the droplets from being continuously ejected.

Furthermore, the metal particle dispersion preferably has a surface tension of 20 to 70 dyn/cm. When the surface tension is less than 20 dyn/cm, the droplets cannot travel in the right direction because the dispersion has high wettability to a nozzle plate. On the other hand, when the surface tension is more than 70 dyn/cm, it is difficult to control the quantity of the dispersion to be ejected and the timing of ejection because the meniscus of the dispersion at the tips of the nozzles is not constant.

The above liquid material 2 is applied by an inkjet method.

The inkjet head 101 used herein includes inkjet heads used for commercial inkjet printers.

As shown in FIG. 1(a), the applied liquid material 2 containing the metal particles is disposed on the first substrate 102, which is then heat-treated in order to remove the solvent to improve the electrical contact between the metal particles. The first substrate 102 is usually heat-treated in the atmosphere and may be heat-treated in an inert gas atmosphere such as a nitrogen, an argon, or a helium gas atmosphere according to needs. The temperature of the heat treatment is not particularly limited and may be determined based on the boiling temperature (vapor pressure) of the solvent, the system pressure, and the thermal behavior of the metal particles. The heat-treating temperature is preferably from room temperature to 300° C.

The first substrate 102 may be heat-treated with an ordinary apparatus such as a hot plate or an electric furnace or heat-treated by a lamp annealing method. A light source used in the lamp annealing method is not limited to a particularly type and includes an infrared lamp, a xenon lamp, a YAG laser system, an argon laser system, a carbon dioxide laser system, and an excimer laser system using XeF, XeCl, XeBr, KrF, KrCl, ArF, or ArCl. These light sources generally have an output power of 10 to 5,000 W. In this embodiment, the power is preferably 100 to 1,000 W.

According to the above procedure, a metal layer 3 is formed as shown in FIG. 1(b).

Step of Forming Lyophobic Region and Lyophilic Region

FIG. 2 is a schematic sectional view showing a substrate used for illustrating steps of forming lyophobic regions and lyophilic regions.

As shown in FIG. 2(a), a self-organizing layer 1001 is provided on a second substrate 1000 for forming a pattern portion having lyophobic regions and lyophilic regions such that a liquid material containing a precursor of a ferroelectric material forms a predetermined contact angle with respect to the self-organizing layer 1001. The contact angle is preferably 30 to 60 degrees.

Various materials can be used for the second substrate 1000 and such materials include silicon, quartz glass, ceramics, and metal. The second substrate 1000 may have a base layer thereon and such a base layer includes a semiconductor layer, a metal layer, and a dielectric layer. The self-organizing layer 1001 disposed on the second substrate 1000 is an organic film that can bond to the second substrate 1000 and is self-organized to form a molecular layer, for example, a monomolecular layer. Such an organic film contains linear molecules having first functional groups that can bond to the second substrate 1000; second functional groups, disposed at the side opposite to the first functional groups, for providing a characteristic surface having lyophobic regions or lyophilic regions to the second substrate 1000, that is, for controlling the surface energy; and carbon chains, which are of a straight or slightly branched type, bonding to the first and second functional groups.

The self-organizing layer 1001 contains the linear molecules having the bonding functional groups that can react with functional groups on the second substrate 1000 or the base layer. The self-organizing layer 1001 has a configuration in which the linear molecules having extremely high orientation are arranged in an oriented manner depending on the interaction between the linear molecules. Since each oriented mono-molecule is arranged in the surface direction, the self-organizing layer 1001 has an extremely small thickness and is uniform on a molecular level. Furthermore, since the same functional groups of the molecules are uniformly arranged on the layer surface, the layer surface has uniform lyophobic regions or lyophilic regions having superior properties.

When a fluoroalkylsilane compound, which has high orientation, is used, the self-organizing layer 1001 has a configuration in which each molecule is arranged such that each fluoroalkyl group is disposed on the layer surface. Thus, the layer surface has lyophobic regions disposed uniformly.

A compound used for forming the self-organizing layer 1001 includes fluoroalkylsilanes, hereinafter referred to as FAS, such as heptadecafluoro-1,1,2,2-tetrahydrodecyltriethoxysilane, heptadecafluoro-1,1,2,2-tetrahydrodecyltrimethoxysilane, heptadecafluoro-1,1,2,2-tetrahydrodecyltrichlorosilane, tridecafluoro-1,1,2,2-tetrahydrooctyltriethoxysilane, tridecafluoro-1,1,2,2-tetrahydrooctyltrimethoxysilane, tridecafluoro-1,1,2,2-tetrahydrooctyltrichlorosilane, and trifluoropropyltrimethoxysilane. These compounds may be used alone or in combination within the scope of the present invention. In the present invention, in order to obtain high adhesion to substrates and superior lyophobic properties, the FAS compounds are preferably used for forming the self-organizing layer 1001.

The FAS compounds are represented by the structural formula $R_nSiX_{(4-n)}$, wherein n represents an integer from 1 to 3; X represents a hydrolyzable group such as a methoxy group, an ethoxy group, and a halogen group; and R represents a fluoroalkyl group represented by the structural formula $(CF_3)(CF_2)_x(CH_2)_y$, where x represents 0 or an integer from 1 to 10 and y represents 0 or an integer from 1 to 4.

When a plurality of the groups represented by R or X bond to a Si atom, the groups may be different from each other or may be the same. The hydrolyzable group represented by X is hydrolyzed into a silanol group, which reacts with a hydroxyl group of base layers of substrates to form a siloxane bond. On the other hand, the fluoroalkyl group, represented by R, which has a fluoric group, such as $CF_3$ group, is disposed on the layer surface. Thus, the layer surface has non-wettability, that is, the-layer surface has low surface energy.

The self-organizing layer 1001 is formed on the second substrate 1000 as follows: a raw material described above and the second substrate 1000 are laid in a single hermetically-sealed vessel for about two to three days when the whole vessel is maintained at room temperature or for about three hours when maintained at 100° C. The above method is called a vapor phase method, and the self-organizing layer 1001 can be formed by a liquid phase method. For example, the second substrate 1000 is soaked in a solution containing the raw material, and the resulting second substrate 1000 is washed and then dried, thereby obtaining the self-organizing layer 1001 disposed on the second substrate 1000. Before the formation of the self-organizing layer 1001, the second substrate 1000 is preferably pretreated by irradiation with ultraviolet rays and/or by washing with a solvent.

A procedure for forming the lyophilic regions is described below. As shown in FIG. 2(b), the self-organizing layer 1001 is irradiated with ultraviolet rays through a mask 1002 having a desired pattern. As shown in FIG. 2(C), parts of the self-organizing layer 1001 irradiated with the ultraviolet rays are then removed. In the portions under the removed parts, hydroxyl groups are disposed on the substrate surface. Thus, these portions have extremely higher wettability as compared with the remaining parts containing a FAS compound. That is, when a layer containing the FAS compound is formed over a substrate and parts of the FAS layer are then removed, the portions under the removed parts have lyophilicity. Thereby, a pattern portion having lyophobic regions and lyophilic regions can be obtained.

Furthermore, second self-organizing layers may be formed on the corresponding portions under the parts of the FAS layer is removed. In the same manner as the FAS compounds, a compound used for forming each second self-organizing layer has a bonding functional group and a functional group for providing a characteristic surface, and the bonding functional group bonds to a hydroxyl group on the substrate surface to form the second self-organizing layer. The functional group of the second self-organizing layers for providing such a characteristic surface includes an amino group, a thiol group, and the like. These groups have high bonding strength to the metal particles or higher lyophilicity as compared with groups of the FAS compounds. Thereby, the reproducibility of the pattern portion is possible and a finally obtained conductive layer having the pattern portion has high adhesive strength to the substrate. The compound used for forming the second self-organizing layer includes 3-mercaptopropyltriethoxysiloxane, 3-mercaptopropyltrimethoxysilane, 3-aminopropyltriethoxysilane, 3-aminopropyltrimethoxysilane, and the like.

First Embodiment

In this embodiment, an inkjet recording head of the present invention includes piezoelectric elements of the present invention. The piezoelectric elements each have a layer, formed by a spin coating method, containing PZT, which is a ferroelectric material, manufactured by a sol-gel method.

FIG. 3 is an exploded perspective view showing the inkjet recording head 1 of this embodiment.

FIG. 4 is a sectional view showing a principal part of the inkjet recording head 1.

As shown in FIG. 3, the inkjet recording head 1 includes a nozzle plate 10, a pressure chamber substrate 20, a vibrating plate 30, and a casing 25.

As shown in FIG. 3, the pressure chamber substrate 20 has cavities 21 and includes partitions 22, a reservoir 23, and supplying ports 24. The cavities 21 are formed by etching a substrate containing silicon or the like and each functions as a pressure chamber. The partitions 22 isolate the corresponding cavities 21. The reservoir 23 functions as a common channel for providing ink to the cavities 21 during ink charge. The ink is introduced into the cavities 21 through the supplying ports 24.

The vibrating plate 30 is disposed on one face of the pressure chamber substrate 20 in a fixed manner. The vibrating plate 30 includes piezoelectric elements 40 according to the present invention. The piezoelectric elements 40 are ferroelectric crystals having perovskite structure, have a predetermined shape, and are disposed on the vibrating plate 30. The nozzle plate 10 has nozzles 11 arranged at positions corresponding to the plurality of cavities (pressure chambers) 21 disposed on the pressure chamber substrate 20. The nozzle plate 10 is disposed on the pressure chamber substrate 20 in a fixed manner. As shown in FIG. 3, the pressure chamber substrate 20 fixed to the nozzle plate 10 is housed in the casing 25, thereby forming the inkjet recording head 1.

FIG. 5 is a sectional view showing a configuration of each piezoelectric element 40.

As shown in FIG. 5, the vibrating plate 30 includes an insulating layer 31 and a lower electrode 32 disposed thereon, and each piezoelectric element 40 includes a piezoelectric layer 41 and an upper electrode 42 disposed thereon. Such a configuration having the lower electrode 32, the piezoelectric layer 41, and the upper electrode 42 provides a piezoelectric function.

The insulating layer 31 contains a non-conductive material, for example, by thermally oxidizing a silicon substrate, and is distorted depending on the change in volume of the piezoelectric layer 41 to instantaneously increase the internal pressure of the cavities 21. The lower and upper electrodes 32 and 42 form a pair and are used for applying a voltage to the piezoelectric layer 41 disposed therebetween. The lower electrode 32 has a configuration in which, for example, a titanium (Ti) layer, a platinum (Pt) layer, and another titanium layer, which are conductive, are arranged in that order. In order to securely join the platinum layer to the piezoelectric layer 41 and the insulating layer 31, the lower electrode 32 has such a layered structure.

The piezoelectric layer 41 contains a ferroelectric material. This ferroelectric material includes lead zirconate titanate (PZT) represented by the formula $Pb(Zr-Ti)O_3$, lead lanthanum titanate represented by the formula $(Pb-La)TiO_3$, lead lanthanum zirconate (PLZ) represented by the formula $(Pb-La)ZrO_3$, lead lanthanum zirconate titanate (PLZT) represented by the formula $(Pb-La)(Zr-Ti)O_3$, lead magnesium niobate titanate represented (PMN-PT) by the formula $Pb(Mg-Nb)TiO_3$, lead magnesium niobate zirconate titanate (PMN-PZT) represented by the formula $Pb(Mg-Nb)(Zr-Ti)O_3$, lead zinc niobate titanate represented (PZN-PT) by the formula $Pb(Zn-Nb)TiO_3$, lead scandium niobate titanate (PSN-PT) represented by the formula $Pb(Sc-Nb)TiO_3$, lead nickel niobate titanate (PNN-PT) represented by the formula Pb(Ni—Nb)TiO$_3$, and compounds represented by the formulas (Ba$_{1-x}$Sr$_x$)TiO$_3$, Bi$_4$Ti$_3$O$_{12}$, SrBi$_2$Ta$_2$O$_9$, LiNbO$_3$, LiTaO$_3$, and KNbO$_3$, where $0 \leq x \leq 0.3$. For example, as the lead magnesium niobate zirconate titanate, the composition formula Pb(Mg$_{1/3}$Nb$_{2/3}$)$_{0.1}$Zr$_{0.504}$Ti$_{0.396}$O$_3$ is preferably used. When the piezoelectric layer 41 is used for surface acoustic wave elements and/or filters, the piezoelectric layer 41 may contain ZnO, which is not a ferroelectric material but a piezoelectric material, other than the above materials.

When the piezoelectric layer 41 has an excessively large thickness, high voltage is required in order to drive the piezoelectric layer 41. In contrast, when the thickness is excessively small, the thickness cannot be even, thereby causing a large property difference in each piezoelectric element 40 obtained after etching and causing the number of manufacturing steps to increase. As a result, the piezoelectric layer 41 cannot be manufactured at reasonable cost. Thus, the piezoelectric layer 41 preferably has a thickness of 500 to 2,000 nm.

The upper electrode 42 is used for applying a voltage to the piezoelectric layer 41. The upper electrode 42 contains a conductive material such as platinum or gold and has a thickness of, for example, 0.1 μm.

A method for manufacturing the piezoelectric elements 40 complying with the above conditions and the inkjet recording head 1 is described below with reference to FIGS. 6 and 7.

In this embodiment, the piezoelectric elements 40 containing PZT, which is a ferroelectric material, are manufactured using an acetic acid solution.

Step of Preparing Acetic Acid Solution (Precursor of Piezoelectric Element)

Lead acetate trihydrate (Pb(CH$_3$COO)$_2$.3H$_2$O), zirconium acetyl acetonate (Zr(CH$_3$COCHCOCH$_3$)$_4$), and magnesium acetate trihydrate (Mg(CH$_3$COO)$_2$.3H$_2$O) are mixed with acetic acid, which is a solvent. The mixture is stirred at room temperature in an initial step and then stirred at about 100° C. for 10 to 20 minutes, and the resulting mixture is cooled at room temperature. Titanium tetraisopropoxide (Ti(O-i-C$_3$H$_7$)$_4$) and niobium pentaethoxide (Nb(OC$_2$H$_5$)$_5$) are added to the resulting mixture, and the resulting mixture is further stirred. Butoxyethanol (C$_4$H$_9$OC$_2$H$_4$OH) is further added to the resulting mixture, and the resulting mixture is stirred at room temperature for about five minutes. Alcohol containing 3% of hydrochloric acid is further added to the resulting mixture, and the resulting mixture is stirred at room temperature for about five minutes. Acetylacetone (CH$_3$COCH$_2$COCH$_3$) is further added to the resulting mixture, and the resulting mixture is stirred at room temperature for about 60 minutes. Polyethylene glycol (HO(C$_2$H$_4$)$_n$H) is finally added to the resulting mixture, and the resulting mixture is stirred at room temperature for about five minutes. According to the above procedure, an acetic acid solution is completed. However, the solution is not limited to such a type.

Step of Forming Insulating Layer (FIG. 6(a))

The insulating layers 31 are formed on the pressure chamber substrate 20 containing silicon, while the acetic acid solution is prepared. The pressure chamber substrate 20 has a thickness of about 200 μm, and the insulating layers 31 have a thickness of about 1 μm. The insulating layers 31 are formed by a known thermal oxidation method or the like.

Step of Forming Lower Electrode (FIG. 6(b))

The lower electrode 32 is formed on one of the insulating layers 31. The lower electrode 32 includes, for example, a first titanium layer having a thickness of 0.01 μm, a titanium oxide layer having a thickness of 0.01 μm, a second titanium layer having a thickness of 0.005 μm, a platinum layer having a thickness of 0.5 μm, and a third titanium layer having a thickness of 0.005 μm. These layers are formed by a known direct current sputtering method. The lower electrode 32 is not limited to such a configuration.

Step of Forming Piezoelectric Layer (FIG. 6(c))

The piezoelectric layer 41 is formed on the lower electrode 32 using the above acetic acid solution according to the following procedure. The acetic acid solution is applied by a spin coating method so as to obtain a predetermined thickness. The conditions are as follows: at 500 rpm for 30 minutes, 1,500 rpm for 30 minutes, and then at 500 rpm for 10 minutes at last. After the coating treatment, the applied solution is dried at a predetermined temperature (for example, 180° C.), for a predetermined period (for example, about 10 minutes). During this drying treatment, butoxyethanol, which is a solvent, is vaporized. After the drying treatment, the resulting solution is degreased at a predetermined temperature (for example, 400° C.), for a predetermined period (for example, about 30) minutes in the atmosphere. In this degreasing treatment, organic ligands coordinate to each metal atom are thermally decomposed and the metal atoms are oxidized into metal oxides, that is, ceramics. The coating treatment, the drying treatment, and the degreasing treatment are repeated a predetermined number of times, for example, eight times, to provide eight ceramic sub-layers. During the drying treatment and the degreasing treatment, the metal alkoxides in the solution are hydrolyzed, and thus a network consisting of metal atoms and oxygen atoms is formed by the poly-condensation of the hydrolysis products.

After four ceramic sub-layers are formed and eight ceramic sub-layers are then formed thereon using the acetic acid solution, the resulting sub-layers are heat-treated in a predetermined atmosphere so as to promote the crystallization of the ceramic material to improve piezoelectric characteristics. For example, the four ceramic sub-layers are heat-treated at 600° C. for five minutes and then at 725° C. for one minutes in an oxygen atmosphere by a rapid thermal annealing (RTA) method. After the eight ceramic sub-layers are formed thereon, the resulting structure is heat-treated at 600° C. for five minutes and then at 900° C. for one minute in an oxygen atmosphere by a rapid thermal annealing (RTA) method. In this heat treatment, the amorphous ceramic material is crystallized to have perovskite crystal structure. As a result of the above treatment, the piezoelectric layer 41 having a predetermined thickness of, for example, 0.8 μm can be obtained.

Step of Etching Piezoelectric Layer (FIG. 6(d))

The piezoelectric layer 41 is etched using a mask placed thereon to remove unnecessary portions from the piezoelectric layer 41 according to the following procedure, wherein the mask has a pattern corresponding to the arrangement of the cavities 21. Before the etching treatment, a resist material is applied to the piezoelectric layer 41 by a coating method such as a spin method or a spraying method so as to form a layer having a uniform thickness. The mask having such a pattern is placed on the resulting resist layer on the piezoelectric layer 41, and the resulting resist layer is exposed and then developed, thereby forming a patterned resist portion on the piezoelectric layer 41. Unnecessary portions are removed from the piezoelectric layer 41 by an ordinary method such as an ion milling method or dry etching method.

Step of Forming Upper Electrode (FIGS. 6(e) and 6(f))

The upper electrode 42 is formed on the piezoelectric layer 41. For example, a liquid material containing metal particles containing gold, platinum, or the like is applied onto the piezoelectric layer 41 by an inkjet method (FIG. 6(e)). After a solvent is removed from the liquid material, in order to sinter the metal particles to form a metal layer, the resulting liquid material is heat-treated, for example, at 300° C. for about 30 minutes with a hot plate, an electric furnace, or the like. According to this heat treatment, the upper electrode 42 having a predetermined thickness of, for example, about 0.1 µm can be obtained (FIG. 6(f)).

Step of Forming Pressure chamber (FIG. 7(b))

One face of the pressure chamber substrate 20, which is opposite to the other face on which the piezoelectric elements 40 are disposed, is etched to form the cavities 21. The spaces of the cavities 21 are formed by for example, an anisotropic etching method using reactive gas and such a method includes a parallel plate-type reactive ion etching method. Remaining portions of the pressure chamber substrate 20 correspond to the partitions 22.

Step of Fixing Nozzle Plate (FIG. 7(a))

The nozzle plate 10 is fixed to the etched pressure chamber substrate 20 with a resin or the like. In this step, the nozzles 11 are each arranged on the corresponding cavities 21. The pressure chamber substrate 20 having the nozzle plate 10 fixed thereto is retained to the casing 25 (see FIG. 3), and thereby the inkjet recording head 1 is completed. Instead of the nozzle plate 10, another nozzle plate having no holes may be fixed to the pressure chamber substrate 20. The nozzle plate and the pressure chamber substrate 20 may be etched in an integrated manner, thereby forming nozzles 11 and the cavities 21.

According to the first embodiment, the piezoelectric elements 40 having the above configuration can be fabricated at lower cost in a simpler manner as compared with conventional manufacturing methods.

Second Embodiment

In a second embodiment of the present invention, piezoelectric layers are formed by an inkjet method using the acetic acid solution according to the first embodiment and thereby piezoelectric elements are formed. The piezoelectric elements of this embodiment have the same configuration as that of the first embodiment, and an inkjet recording head of this embodiment also has the same configuration as that of the first embodiment. Therefore, the description is omitted.

A method for manufacturing the piezoelectric elements and the inkjet recording head of this embodiment is described with reference to FIG. 8. In this manufacturing method, the piezoelectric layers are formed by applying the acetic acid solution by an inkjet method. However, a solution used in this embodiment is not limited to such a type. An acetic acid solution-preparing step is the same as that of the first embodiment and therefore the description is omitted. An insulating layer-forming step (FIG. 8(a)) and a lower electrode-forming step (FIG. 8(b)) are the same as the corresponding steps of the first embodiment and therefore the description is omitted.

Step of Forming Piezoelectric Layer (FIG. 8(c))

Piezoelectric layers 41 are formed on a lower electrode 32 using the acetic acid solution. The acetic acid solution is applied onto each portion corresponding to each cavity 21 by an inkjet method so as to form a layer having a predetermined thickness. The acetic acid solution may be diluted with alcohol, for example, so as to have such properties that is suitable for the application of the solution by the inkjet method. In the same manner as that, of the first embodiment, coating treatment, drying treatment, and degreasing treatment are repeated a predetermined number of times, and the obtained structure is then heat-treated in a predetermined atmosphere. According to the above procedure, the piezoelectric layers 41 having a predetermined thickness of, for example, 0.8 µm are each formed on the corresponding portions corresponding to the cavities 21. An upper electrode-forming step (FIGS. 8(d) and 8(e)) is the same as that of the first embodiment, and therefore the description is omitted.

Furthermore, a pressure chamber-forming step and a nozzle plate-fixing step are the same as the corresponding steps of the first embodiment, and therefore the description is also omitted.

According to the second embodiment, the piezoelectric layer-etching step of the first embodiment can be omitted. Thus, the piezoelectric layers 41 having the above configuration can be fabricated at lower cost in a simpler manner as compared with the method of the first embodiment.

Third Embodiment

In a third embodiment of the present invention, the acetic acid solution according to the first embodiment is applied onto a substrate having a pattern portion having lyophobic regions and lyophilic regions by an inkjet method to form piezoelectric layers, and thereby piezoelectric elements are formed.

The piezoelectric elements of this embodiment has the same configuration as that of the first embodiment, and an inkjet recording head of this embodiment also has the same configuration as that of the first embodiment. Therefore, the description is omitted.

A method for manufacturing the piezoelectric elements and the inkjet head of the present invention is described with reference to FIG. 9. In this manufacturing method, the acetic acid solution is applied onto a substrate having a pattern having lyophobic regions and lyophilic regions by an inkjet method to form the piezoelectric layers. An acetic acid solution-preparing step is the same as that of the first embodiment and therefore the description is omitted. An insulating layer-forming step (FIG. 9(a)) and a lower electrode-forming step (FIG. 9(b)) are the same as the corresponding steps of the first embodiment and therefore the description is omitted.

Step of Forming Pattern Portion Having Lyophobic Region and Lyophilic Region (FIG. 9(c))

This step is the same as Step of Forming Lyophobic Region and Lyophilic Region (see FIG. 2) described above in detail and therefore the description is omitted.

Step of Forming Piezoelectric Layer (FIG. 9(d))

This step is the same as the corresponding step of the second embodiment in principle. In the second embodiment, the acetic acid solution must be applied to portions corresponding to the cavities 21 with high preciseness. In contrast, in this embodiment, the solution need not be precisely applied to such portions as compared with the procedure of the second embodiment because there is a pattern portion having lyophobic regions 80 and lyophilic regions 81 and the applied solution is self-aligned on the lyophilic regions 81. Thus, it is possible to form a pattern having a line width smaller than the size of a solution droplet. Subsequently, coating treatment, drying treatment, and degreasing treatment are repeated a predetermined number of times, and the resulting structure is then heat-treated in a predetermined atmosphere. In the heat-treating step (FIG. 9(e)), which is the final step, the lyophobic regions 80, which are self-organizing layers, are removed. According to the above procedure, piezoelectric layers 41 are formed on positions corresponding to the cavities 21.

An upper electrode-forming step (FIGS. 9(f) and 9(g)) is the same as that of the first embodiment and therefore the description is omitted. Self-organizing layers may be used for forming upper electrodes.

A pressure chamber-forming step and a nozzle plate-fixing step are the same as the corresponding steps of the first embodiment and therefore the description is omitted.

According to the third embodiment, the piezoelectric layers 41 can be arranged with higher preciseness as compared with the second embodiment, thereby obtaining high yield.

The present invention is not limited to the above embodiments and intended to cover various modifications. Other than the above inkjet recording head, a piezoelectric element of the present invention can be used for ferroelectric devices such as nonvolatile semiconductor storage (ferroelectric memory), thin-film capacitors, pyroelectric detectors, sensors, surface acoustic wave elements, filters, surface acoustic wave light guides, optical memories, spatial light modulators, and frequency doublers for diode laser systems; dielectric devices; pyroelectric devices; piezoelectric devices; and photoelectric devices.

EXAMPLES

Examples of the present invention will now be described. The present invention is not limited to such examples.

Example 1

According to any one of the above embodiments, a liquid material containing gold particles was applied onto a PZT thin-film formed by a sol-gel method, and the applied liquid material was then transformed into a gold thin-film.

The gold particle-containing liquid material was prepared as follows: xylene was added to a gold particle dispersion ("Perfect Gold" manufactured by Vacuum Metallurgical Co., Ltd.) containing toluene and gold particles, dispersed therein, having a particle size of 10 nm such that the resulting dispersion has a dispersant content of 15% by weight, a viscosity of 3 cP, a surface tension of 25 mN/m. An inkjet head included in a commercial ink jet printer ("MJ930-C") was used. The inkjet head was equipped with a metal suction port improved so as to have resistance to an organic solvent. A pattern portion having a line width of 30 $\mu$m and a space width of 30 $\mu$m was formed by a inkjet method, the resulting pattern portion was heated at 300° C. for 30 minutes with a hot plate, thereby obtaining a line-space pattern portion comprising a gold thin-film.

The gold thin-film had a thickness of 0.1 $\mu$m and a resistivity of $3\times10-6$ $\Omega$cm, which are values sufficient for practical use.

Example 2

In this embodiment, a method for manufacturing a piezoelectric element including piezoelectric layers formed by an inkjet method is described with reference to FIG. 5.

An insulating layer 31, which is an amorphous $SiO_2$ layer formed by a thermal oxidizing method, was provided on a pressure chamber substrate 20, which is a $SiO_2$ (100) single-crystal substrate.

A layer containing yttria-stabilized zirconia (hereinafter referred to as YSZ) was epitaxially grown on the amorphous $SiO_2$ layer at room temperature by an ion beam-assisted laser abrasion method so as to be oriented to the (100) plane.

In the same manner as the above, a layer containing cerium oxide (hereinafter referred to as $CeO_2$) was epitaxially grown on the YSZ layer at 600° C. by the laser abrasion method so as to be oriented to the (001) plane.

A layer containing $YBa_2Cu_3O_7$ was epitaxially grown on the $CeO_2$ layer at 600° C. by the laser abrasion method so as to be oriented to the (100) plane.

A layer containing $SrRuO_3$, which is an oxide conductor, was epitaxially grown on the $YBa_2Cu_3O_7$ layer so as to have the pseudocubic crystal structure and so as to be oriented to the (100) plane, wherein the $SrRuO_3$ layer corresponds to a lower electrode 32. The YSZ, $CeO_2$, and $YBa_2Cu_3O_7$ layers each function as a buffer layer for epitaxially growing the $SrRuO_3$ layer having a perovskite structure. Therefore, each layer may have a small thickness of 50 nm or less. According to this configuration, a layer having such a perovskite structure can be epitaxially grown on an amorphous layer. However, the present invention is not limited to these materials.

A liquid material containing a precursor for forming piezoelectric layers 41 was applied onto the lower electrode 32 by an inkjet method. In principal, in the same manner as a manufacturing method using a spin coating process, coating treatment, drying treatment, and degreasing treatment are repeated a predetermined number of times, and heat treatment is then performed in a predetermined atmosphere. In particular, the following procedure was repeated for ten times: the liquid material was applied onto the lower electrode 32, dried at 180° C. with a hot plate, and then degreased at 400° C., and this procedure. The resulting liquid material was heat-treated at 650° C. for ten minutes in an oxygen atmosphere by a rapid thermal annealing method, thereby obtaining the piezoelectric layers 41 containing PZT.

FIG. 10 is an illustration showing X-ray diffraction patterns of the piezoelectric layers 41.

As shown in FIG. 10(a), in a 2θ-θ scan, except for peaks assigned to the Si (400) plane of the pressure chamber substrate 20, the $SrRuO_3$ (200) plane of the lower electrode 32, and the Pt (111) plane of an upper electrode 42, there is a peak assigned to the (100) plane of rhombohedral PZT alone. As shown in FIG. 10(b), in a $\phi$ scan, there are four-fold rotational symmetric peaks assigned to the PZT (111) plane. From the rocking curve shown in FIG. 10(c), it is clear that a peak assigned to the PZT (200) plane has a half-width of 1.0°, which is the same value as that of the $SrRuO_3$ (200) plane of the base layer. That is, it is clear that PZT is epitaxially grown depending on the $SrRuO_3$ crystal of the lower electrode 32. This phenomenon can be observed when PZT is formed on the base layer by a spin coating method. A first sample, whose upper electrode 42 is manufactured by the method according to example 1, including a first piezoelectric layer formed by an inkjet method has substantially the same electrical characteristics as that of a second sample, whose upper electrode 42 is manufactured by the method according to example 1, including a second piezoelectric layer formed by a spin coating method. These samples have a residual polarization of about 50 $\mu$C/cm$^2$ and a piezoelectric constant d31 of about 210 pC/N, which are large values. It is presumed that this phenomenon results from the epitaxial growth of PZT. A third sample prepared according to the following procedure has the same crystallinity and electrical characteristics as those of the above samples: a pattern portion having lyophobic regions and lyophilic regions are formed on a SrRuO$_3$ layer using a FAS material, and a PZT piezoelectric layer is then formed. That is, it is clear that the FAS material have no reverse effects on the crystallinity of PZT.

The substrate, the lower electrode, and the piezoelectric layer are not limited to the above corresponding types. The present invention is not limited to the above layers, and uniaxially oriented films and polycrystalline thin-films may be used. Furthermore, the present invention is not limited to the buffer layer-forming method and the lower electrode-forming method.

The entire disclosure of Japanese Patent Application Nos. 2002-117849 filed Apr. 19, 2002 and 2003-020804 filed Jan. 29, 2003 are incorporated by reference.

What is claimed is:

1. A method for manufacturing a piezoelectric element including a piezoelectric layer containing a ferroelectric material, comprising:
    applying droplets of liquid containing a solvent and metal particles dispersed in the solvent to the piezoelectric layer;
    removing the solvent from the applied droplets by heat treatment; and
    sintering the metal particles to form a metal layer.

2. The method for manufacturing a piezoelectric element according to claim 1, wherein the droplets are applied by a droplet ejecting method and the metal particles are coated with an organic material.

3. The method for manufacturing a piezoelectric element according to claim 1 further comprising adjusting an amount of the metal particles dispersed in the solvent so that the metal layer has a desired thickness.

4. The method for manufacturing a piezoelectric element according to claim 1, wherein the metal particles contain at least one of platinum, gold, silver, copper, palladium, nickel, iridium, ruthenium and titanium.

5. The method for manufacturing a piezoelectric element according to claim 1, further comprising:
    forming the piezoelectric layer, including:
        preparing a liquid containing a precursor of a ferroelectric material;
        applying liquid droplets containing the precursor to a substrate by the droplet ejecting method;
        removing a solvent in the droplets containing the precursor by heat treatment; and
        transforming the precursor into a ferroelectric layer to form the piezoelectric layer.

6. The method for manufacturing a piezoelectric element according to claim 5, wherein the liquid containing the precursor is applied onto a substrate having lyophobic regions and lyophilic regions.

7. The method for manufacturing a piezoelectric element according to claim 6 further comprising:
    forming the lyophobic regions and lyophilic regions, wherein forming the regions includes:
        providing a self-organizing film containing fluoroalkylsilane on the substrate; and
        irradiating the self-organizing film with ultraviolet rays on desired areas to remove parts of the self-organizing film to form the lyophilic regions, the remaining parts of the self-organizing film to form the lyophobic regions.

8. The method for manufacturing a piezoelectric element according to claim 7, wherein the piezoelectric layer contains at least one of the group consisting of lead zirconate titanate (PZT) represented by the formula Pb(Zr—Ti)O$_3$, lead lanthanum titanate represented by the formula (Pb—La)TiO$_3$, lead lanthanum zirconate (PLZ) represented by the formula (Pb—La)ZrO$_3$, lead lanthanum zirconate titanate (PLZT) represented by the formula (PB—La)(Zr—Ti)O$_3$, lead magnesium, niobate titanate (PMN-PT) represented. by the formula Pb(Mg—Nb)TiO$_3$, lead magnesium niobate zirconate titanate (PMN-PZT) represented by the formula Pb(Mg—Nb)(Zr—Ti)O$_3$, lead zinc niobate titanate (PZN-PT) represented by the formula Pb(Zn—Nb)TiO$_3$, lead scandium niobate titanate (PSN-PT) represented by the formula Pb(Sc—Nb)TiO$_3$, lead nickel niobate titanate (PNN-PT) represented by the formula Pb(Ni—Nb)TiO$_3$, and compounds represented by the formulas (Ba$_{1-x}$Sr$_x$)TiO$_3$, Bi$_4$Ti$_3$O$_{12}$, SrBi$_2$Ta$_2$O$_9$, LiNbO$_3$, LiTaO$_3$, and KNbO$_3$, wherein $0 \leq x \leq 0.3$.

* * * * *